United States Patent [19]

Williams

[11] 4,032,894
[45] June 28, 1977

[54] LOGIC ARRAY WITH ENHANCED FLEXIBILITY

[75] Inventor: Robert Russell Williams, Rochester, Minn.

[73] Assignee: International Business Machines Corporation, Armonk, N.Y.

[22] Filed: June 1, 1976

[21] Appl. No.: 691,807

[52] U.S. Cl. .......................... 340/166 R; 307/303
[51] Int. Cl.² .................. H03K 19/08; H04Q 9/00
[58] Field of Search ................. 340/166 R; 307/303

[56] References Cited
UNITED STATES PATENTS 3,818,252  6/1974  Chiba .............................. 307/303

Primary Examiner—Harold I. Pitts

[57] ABSTRACT

A single-chip programmable logic array (PLA) in which the AND (search) array outputs are coupled to the OR (readout) array through a NOT array of selectable on-chip inverters. Provision is also made for selectable interconnection of inverted or non-inverted NOT array outputs to each other.

6 Claims, 3 Drawing Figures

LOGIC ARRAY WITH ENHANCED FLEXIBILITY

BACKGROUND

The present invention relates to electrical circuits of the digital-logic type, and more particularly concerns regularized integrated-circuit structures which can be personalized to perform many different logic functions. Such "programmable logic arrays" have been used to replace random logic in many fields, and are especially useful in the control section of microprogrammed data processors.

A programmable logic array (PLA) may be viewed in several different ways. Its inputs may be considered to be word addresses to a potentially very large read-only storage (ROS), and its outputs represent the contents of the addressed word; however, only a relatively small number of the potentially addressable words are actually implemented in the PLA. Another way to view a PLA is as an associative or content-addressable memory (CAM). The inputs then may be taken to represent a search argument, and the outputs represent the logic sum of all the matches for that argument. The third approach is to consider a PLA as a generalized two-level Boolean logic circuit, capable of implementing a certain number of product terms involving any of the inputs, and of OR'ing any of these terms to any output.

This third approach emphasizes the actual physical structure of the PLA. While the PLA user frequently finds it more convenient to think in terms of ROS and CAM concepts, the Boolean-logic view reminds him that the actual resources available to implement these concepts are limited to a fixed, and relatively small, number of logic functions of a particular kind. These functions are usually called "product terms", although they may not actually be simple logical products, in some implementations. In order to make most efficient use of the PLA's resources, the user must employ one of the conventional minimization techniques (e.g., Karnaugh mapping) for the overall function to be implemented. When the goal is to recognize the presence of particular input combinations, conventional PLA structures are efficient. For example, an output representing the occurrence of the specific input pattern 10011110, or of the specific group 1110XXXX (where X represents a "don't care" condition) can be performed with only a single product term each.

It is just as likely, however, that the user will desire an output to represent the absence of a particular combination, rather than its presence. He may wish, for example, to increment a counter for all input combinations except 10011110, or upon the non-occurrence of an operation code in the group 1110XXXX. Such negative conditions become very difficult to implement in conventional PLA's, because they require an excessive number of the type of product terms heretofore made available. Another frequent requirement involves the activation of an output bit upon the simultaneous occurrence of one positive and one negative condition, such as the first four inputs being all zeros, while the next four inputs are not all ones. In a microprogram control unit, for example, an instruction might require the repetition of an action for a specified number of times. The repetition condition might be most conveniently expressed as the presence of a particular operation code and a count-down register contents of other than zero. Again, conventional PLA structures inplement such conditions only at an excessive cost in terms of the number of product terms which can be placed on a single chip.

SUMMARY

The present invention provides a single-chip integrated-circuit programmable logic array which permits negative conditions to be implemented as easily as positive conditions, with no significant increase in chip size, cost or power dissipation. In some cases, in fact, no additional active circuitry is required at all. Another aspect of the invention allows multiple conditions, including combinations of positive and negative conditions, to be implemented efficiently. Stated another way, the invention can implement many common logic functions with less circuitry than a conventional PLA, by enabling such logic functions to be minimized either to their true or complement forms, or even to a combination of these forms.

Generally speaking, a single-chip PLA according to the invention has a set of input lines to a search (AND) array selectively connectable to the input lines. A complement (NOT) array has a plurality of inverters selectively connectable to the outputs of the search array. A read (OR) array then has inputs selectively connectable to the outputs of the complement array. That is, the invention inserts a programmable complement array between the programmable search and read arrays of a conventional PLA. The complement array may also provide for interconnection of its outputs among each other. This PLA, like conventional structures of its genre, may also have feedback outputs, input decoders, and so forth.

DRAWINGS

Figure 2:
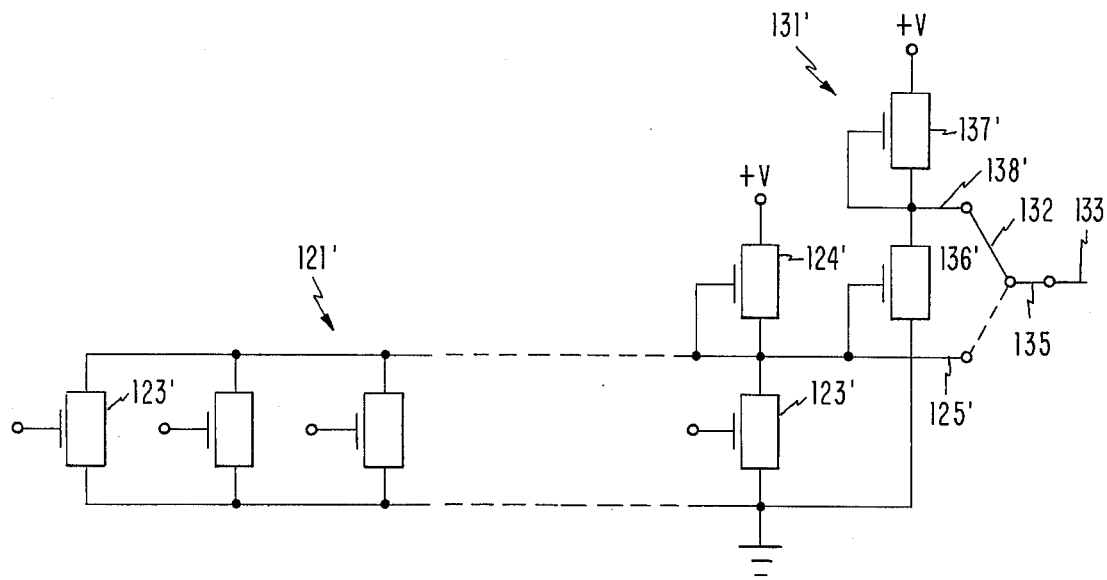
FIG. 2 is a diagram of a portion of the AND and NOT circuit arrays of FIG. 1.
Figure 3:
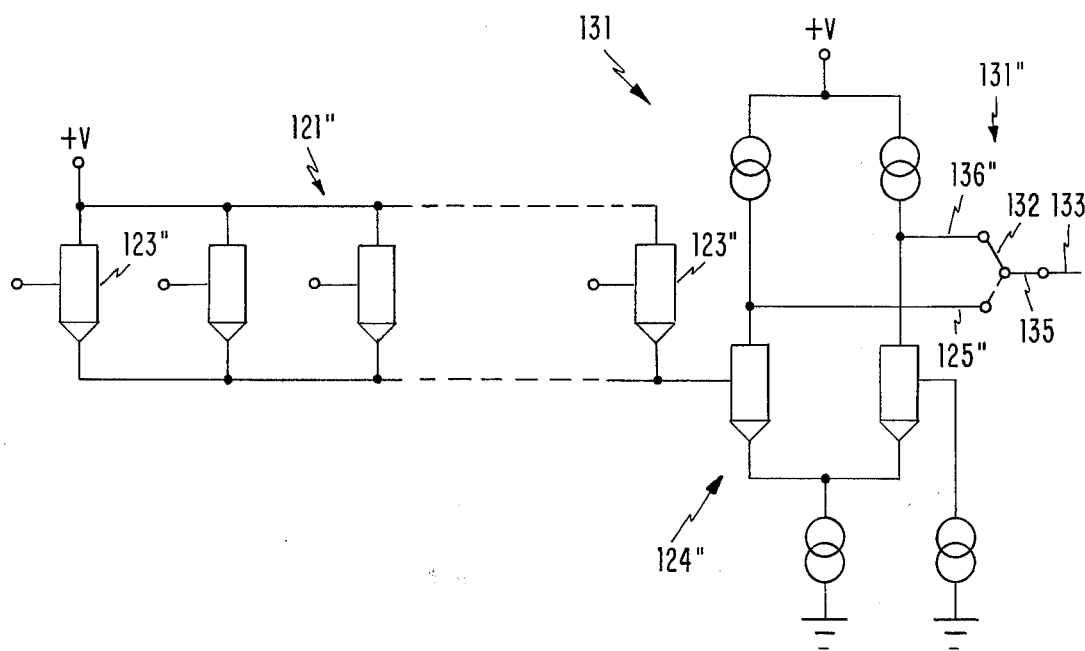

FIG. 3. is a diagram of another form of the circuits shown in FIG. 2.

DETAILED DESCRIPTION

Figure 1:
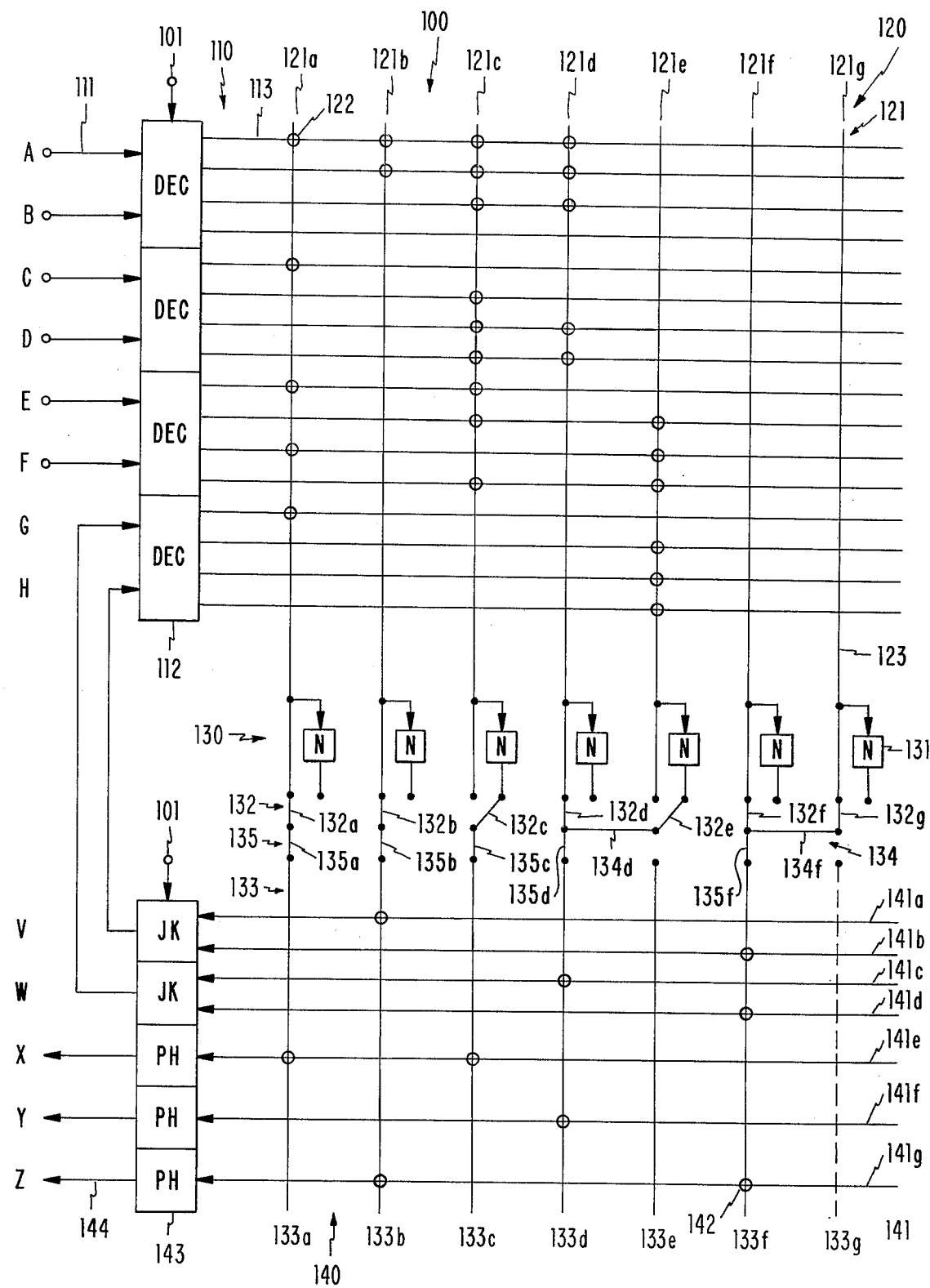
FIG. 1 is a schematic representation of a PLA structure incorporating the invention.

FIG. 1 shows a PLA 100 fabricated on a single integrated-circuit chip or substrate by entirely conventional methods.

Input circuit 110 includes a set of input terminals 111, a set of input decoders 112 and a set of input rows or rails 113. As in conventional practice, decoders 112 may be enabled with a common clock line 101. For purposes of explanation, decoders 112 may be taken to be single-rail to two-rail converters. That is, if terminals 111 are given to the designations A, B, C, etc., then lines 113 represent A, $\bar{A}$, B, $\bar{B}$, C, $\bar{C}$, and so forth.

Search array 120 has a set of AND gates represented by the vertical lines 121. Every gate 121 in array 120 has a selectable input at its intersection with each line 113. As in conventional practice, the inputs which are actually connected are shown by circles such as 122. Gate 121a, for example, produces a "one" output for the combination A.C.F.G at terminals 111. It is the number of AND gates 121a-121g on a chip which determines how many product terms are available.

The outputs or output columns 123 of AND gates 121 are coupled to inverters 131 of complement array 130. Inversion links 132 selectively connect NOT-array output lines 133 either to the corresponding AND-array output columns 123 or to the output of an inverter 131. Link 132a, for example transmits the true form of AND 121a to line 133, while link 132c selects the inverted form from AND gates 121c. Links 132 may be personalized in the same conventional way as the inputs to AND gates 121: i.e., by a metallization mask used during fabrication of PLA 100. Other conventional personalization methods, such as field-programmable fusible links or trapped-charge effects, may also be employed.

In addition to selectable links 132, array 130 provides for selectable inter-term links 134. These links allow the output signal of each column of the complement array to be tied to the output of one or more other columns, as shown at 134d and 134f. When columns are tied together in this "dot-OR" fashion, all but one of the output lines 133 in each group are severed from NOT array 130 by omitting the corresponding link 135. When product-term columns are dotted together, such as at 134d, only one of the associated output links 135d is emplaced. Where an output link is omitted, the entire output line may also be omitted, as at 133f. This serves to lower undesirable capacitive effects to some degree. Or, the unused line may be used by another term, from a split AND array of the type shown in U.S. Pat. No. 3,936,812 to Cox et al., issued Feb. 3, 1976.

Finally, a read (OR) array 140 contains multiple OR gates in output rows 141. The inputs of these gates are selectively coupled to lines 133 in a conventional manner, as indicated by circles 142. That is, lines 133 may be considered input columns to array 140, as well as outputs of array 130. The signals produced by OR gates 141 may be transmitted to clocked latches 143, which produce PLA output bits at terminals 144. Again as in conventional practice, some of the outputs, labelled V and W, are fed back internally to inputs G and H. The remaining outputs X-Z are available externally. In some PLA's, certain outputs may be both internal and external. The latches for OR gates 141c-141g are shown as "polarity-hold", which hold the state of their inputs upon the occurrence of a clock signal 101. Feedback outputs V and W are connected to JK latches or flip-flops. The uppermost latch, for example, is set upon the occurrence of clock 101 if the output of OR 141a is true; it is reset by clock 101 when OR 141b is true. If neither input is true, then the latch retains its previous state; if both are true, it toggles to the opposite state. Some PLA's have latches which can be individually programmed to provide polarity-hold, JK and other latch functions at will.

The foregoing description sets forth a simple form of PLA 100. The present invention, however, is also compatible with input decoders 112 of a preferred conventional form which convert a pair of input signals into groups of four signals. This form of decoder has been described in U.S. Pat. No. 3,761,902 to Weinberger, issued Sept. 25, 1973, and has been applied to prior-art PLA's in the aforementioned U.S. Pat. No. 3,936,812. Taking the inputs 111 labelled A and B as an example, a decoder 112 of this type produces signals representing four terms on four separate outputs. Table I shows these terms, and shows the effect of a connection (*) or no connection (−) of all combinations of these lines to the inputs of one of the AND gates 121.

TABLE I

| A . B Output | A . $\overline{B}$ Output | $\overline{A}$ . B Output | $\overline{A}$ . $\overline{B}$ Output | Function Formed |
|---|---|---|---|---|
| − | − | − | − | Always true |
| − | − | − | * | A + B |
| − | − | * | − | A + $\overline{B}$ |
| − | − | * | * | A |
| − | * | − | − | $\overline{A}$ + B |
| − | * | − | * | B |
| − | * | * | − | A = B |
| − | * | * | * | A · B |
| * | − | − | − | $\overline{A}$ + $\overline{B}$ |
| * | − | − | * | A ≠ B |
| * | − | * | − | $\overline{B}$ |
| * | − | * | * | A · $\overline{B}$ |
| * | * | − | − | $\overline{A}$ |
| * | * | − | * | $\overline{A}$ · B |
| * | * | * | − | $\overline{A}$ · $\overline{B}$ |
| * | * | * | * | Always false |

Such "bit partitioning" decoders do not affect the operation of the present invention, but they do enhance its utility.

FIG. 2 shows one way of implementing complement array 130 in PLA 100. Each gate 121' of search array 120 is actually a negative-AND gate having paralleled field-effect transistors (FET's) 123, whose gates are capable of being coupled to respective ones of the lines 113, FIG. 1. FET 124' is a constant-current source coupled to the supply voltage +V. Thus, the output 125' of gate 121' is high if and only if every input is low. (A negative-AND gate may also, of course, be considered a positive-NOR gate; i.e., the output is low if any one or more of the inputs is high.)

Inverter 131' comprises an FET 136' having its gate coupled to output 125'. Its drain is coupled to the supply voltage +V through load FET 137'. Inverting output terminal 138' proceeds from the junction of FET's 136' and 137'. Selectable link 132 may than be connected either to terminal 125' or to terminal 138', to obtain either a true or an inverted (complementary) output to line 133.

FIG. 3 shows another way of including the present invention in an otherwise conventional PLA. Gate 121" of search array 120 is also a negative-AND gate, and has bipolar input transistors 123" whose bases may be selectively coupled to lines 113, FIG. 1. As long as all transistors 123" remain cut off, the left transistor of differential stage 124" is cut off, and its associated current source pulls up output line 125". But, when any of the transistors 123" turns on, line 125" is pulled down. The common emitter current sink then forces the other transistor to cut off, as is well known in the field of non-saturated digital logic circuits. Inverter 131" of NOT array 130 is then formed by bringing an external line 136" out where it may be selectively connected by link 132 to output line 133. In this way, the inversion function required for NOT array 130 may be provided with no additional active devices, and with a very small increase in chip area.

Returning to FIG. 1, the signals on lines 133a and 133b are also obtainable with a conventional PLA, since links 135a and 135b were both employed to select the corresponding "true" outputs of complement array 130. Using Table I, the signal on 133a represents (A+B).(C+D).(E+F), while line 133b is true whenever A is true, regardless of the states of any other input terminals 111.

Line 133c carries a signal representing the situation referred to earlier, where it is desired to recognize the absence of a particular input combination, rather than its presence. The connections between lines 113 and AND gate 121c produce a signal for the combination 110010 of the input signals A-F. But link 132c selects the inverse of this signal, so that line 133c is true at all times except when this combination appears. If an output bit representing this condition alone were desired, a simple inverter at an output terminal 144 would suffice; there are PLA's which have programmable inverters at their outputs, allowing a selection of active-high or active-low conditions for each bit. The advantage of the invention appears when other conditions are attached. In FIG. 1, for example, line 133c is combined with line 133a in OR array 130, so that output bit X, on line 141e, is true whenever inputs A-F are not 110010, or whenever at least one signal of each pair A-B, C-D and E-F is true. The overall specification of this output bit requires only two product terms in PLA 100.

Lines 121d and 121e illustrate another situation. Since link 132d selects the noninverted output of NOT array 130, the signal thereon represents the presence of one of the combinations 110XXX of external inputs A-F, respectively. Line 132e is placed in the "inversion" position, so that the signal thereon is true whenever the inputs E-H are not all true. In this case, line 133e is decoupled from NOT array 130, and a line 134d instead ties link 132e to link 135d. Therefore, line 133d is true for a particular group of input signals unless another predefined group is also present. Links 134 are not restricted to use with the inverted outputs of array 130, as shown at 134f. Further, links 134 may interconnect any number of adjacent columns in NOT array 130, rather than merely two columns as at 134d and 134f.

Other modifications to the illustrative embodiments, as well as other features and advantages of the invention, will be obvious to those skilled in the art.

I claim as my invention:

1. In a programmable logic array chip including a search array for providing a set of search signals on respective ones of a plurality of output columns, said output columns being selectively connectable to a plurality of input rows, and a read array for providing a set of output signals on a plurality of output rows, said output rows being selectively connectable to a plurality of input columns, the improvement comprising:

a complement array having means for providing both true and complement forms of each of said search signals, and having means for selectively coupling one of said forms of each of said search signals to said input columns.

2. The programmable logic array of claim 1, wherein said complement array includes a plurality of inverters, each having an input coupled to one of said output columns, and each having an output providing said complement form of one of said search signals.

3. The programmable logic array of claim 2, wherein said selective coupling means comprises a plurality of conductive links, each of said links being selectively connectable to the input and to the output of one of said inverters.

4. The programmable logic array of claim 1, wherein said search array includes a plurality of gates having differential circuits, and wherein said complement array includes two connections to each of said stages, for providing said true and complement forms of each said search signal.

5. The programmable logic array of claim 1, further comprising means for selectively interconnecting adjacent ones of said input columns to each other.

6. The programmable logic array of claim 5, wherein said means for interconnecting comprises a plurality of links for selectively coupling said complement array among different ones of said input columns.

* * * * *